United States Patent
Fang

(10) Patent No.: US 12,302,591 B2
(45) Date of Patent: *May 13, 2025

(54) METHOD FOR FABRICATING POLY-INSULATOR-POLY CAPACITOR

(71) Applicant: UNITED MICROELECTRONICS CORP., Hsin-Chu (TW)

(72) Inventor: Linggang Fang, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 215 days.

This patent is subject to a terminal disclaimer.

(21) Appl. No.: 17/882,596

(22) Filed: Aug. 7, 2022

(65) Prior Publication Data

US 2022/0376037 A1 Nov. 24, 2022

Related U.S. Application Data

(62) Division of application No. 17/142,268, filed on Jan. 6, 2021, now Pat. No. 11,444,151.

(30) Foreign Application Priority Data

Dec. 8, 2020 (TW) ................................. 109143136

(51) Int. Cl.
*H10D 1/68* (2025.01)
*H10D 1/00* (2025.01)
(Continued)

(52) U.S. Cl.
CPC ............. *H10D 1/684* (2025.01); *H10D 1/042* (2025.01); *H10D 1/68* (2025.01); *H10D 1/692* (2025.01);
(Continued)

(58) Field of Classification Search
CPC ........... H10D 1/62; H10D 1/66; H10D 1/682; H10D 1/684; H10D 1/692; H10D 64/035;
(Continued)

(56) References Cited

U.S. PATENT DOCUMENTS

| 11,444,151 B2 * | 9/2022 | Fang ................ H10D 1/684 |
| 2012/0168905 A1 * | 7/2012 | Ryu .................. H10D 1/66 |
| | | 257/E29.342 |

(Continued)

FOREIGN PATENT DOCUMENTS

| CN | 101022094 A | 8/2007 |
| CN | 101064282 A | 10/2007 |

(Continued)

*Primary Examiner* — Aaron J Gray
(74) *Attorney, Agent, or Firm* — Winston Hsu

(57) ABSTRACT

A method for forming a poly-insulator-poly (PIP) capacitor is disclosed. A semiconductor substrate having a capacitor forming region is provided. A first capacitor dielectric layer is formed on the capacitor forming region. A first poly electrode is formed on the first capacitor dielectric layer. A second capacitor dielectric layer is formed on the first poly electrode. A second poly electrode is formed on the second capacitor dielectric layer. A third poly electrode is formed adjacent to a first sidewall of the second poly electrode. A third capacitor dielectric layer is formed between the third poly electrode and the second poly electrode. A fourth poly electrode is formed adjacent to a second sidewall of the second poly electrode that is opposite to the first sidewall. A fourth capacitor dielectric layer is formed between the fourth poly electrode and the second poly electrode.

8 Claims, 5 Drawing Sheets

(51) Int. Cl.
*H10D 1/66* (2025.01)
*H10D 64/01* (2025.01)

(52) U.S. Cl.
CPC ............ *H10D 1/716* (2025.01); *H10D 1/665* (2025.01); *H10D 64/035* (2025.01)

(58) Field of Classification Search
CPC ...... H10D 30/6892; H10D 1/68; H10B 41/00; H10B 41/30
See application file for complete search history.

(56) References Cited

U.S. PATENT DOCUMENTS

| | | | |
|---|---|---|---|
| 2013/0076335 A1* | 3/2013 | Lin | ............... H10D 84/212 |
| | | | 257/E29.345 |
| 2013/0093053 A1 | 4/2013 | Toyoda | |
| 2015/0076577 A1* | 3/2015 | Bo | ............... H10D 84/811 |
| | | | 257/532 |
| 2019/0333921 A1* | 10/2019 | Liu | ............... H10B 41/30 |

FOREIGN PATENT DOCUMENTS

| | | |
|---|---|---|
| CN | 101197371 | 6/2008 |
| CN | 101211849 | 7/2008 |
| CN | 101465384 A | 6/2009 |
| CN | 101834213 A | 9/2010 |
| CN | 107611117 A | 1/2018 |
| CN | 109427785 A | 3/2019 |
| KR | 10-0861825 B1 | 10/2008 |

\* cited by examiner

METHOD FOR FABRICATING POLY-INSULATOR-POLY CAPACITOR

CROSS REFERENCE TO RELATED APPLICATIONS

This application is a division of U.S. application Ser. No. 17/142,268, filed on Jan. 6, 2021. The content of the application is incorporated herein by reference.

BACKGROUND OF THE INVENTION

1. Field of the Invention

The present invention relates to the field of semiconductor technology, in particular to a poly-insulator-poly (PIP) capacitor and a manufacturing method thereof.

2. Description of the Prior Art

With the increase in the degree of integration of semiconductor components, the size of the components gradually shrinks, and the space for the integrated capacitor in the semiconductor chip becomes smaller and smaller, thus reducing the capacitance of the capacitor. In the deep sub-micron era, the reduction of the capacitance of the integrated capacitor is more serious.

For the current 55 nm technology node, the integrated capacitors in the semiconductor chip are mainly made with a laterally coupled metal-oxide-metal (MOM) multilayer stack structure. In order to withstand higher operating voltages, the metal stacks of high-voltage (>5V) MOM capacitors need to have a wider inter-metal width, so the unit capacitance is reduced and MOM capacitors occupy a lot of area. For very high voltage (for example, >10V) MOM capacitors, the vertical breakdown between the upper and lower metals becomes a bottleneck. In order to increase the breakdown voltage BV, it is sometimes necessary to skip the middle metal layer, resulting in a further decrease in unit capacitance.

SUMMARY OF THE INVENTION

It is one object of the present invention to provide a high-voltage polysilicon-insulator-polysilicon (PIP) capacitor and a manufacturing method thereof, so as to solve the above-mentioned shortcomings of the prior art.

According to one aspect of the invention, a poly-insulator-poly (PIP) capacitor includes a semiconductor substrate comprising a capacitor forming region; a first capacitor dielectric layer disposed on the capacitor forming region; a first poly electrode disposed on the first capacitor dielectric layer; a second capacitor dielectric layer disposed on the first poly electrode; a second poly electrode disposed on the second capacitor dielectric layer, wherein the first poly electrode comprises a contact portion that protrudes beyond an end surface of the second poly electrode; a third poly electrode disposed adjacent to a first sidewall of the second poly electrode; a third capacitor dielectric layer disposed between the third poly electrode and the second poly electrode; a fourth poly electrode disposed adjacent to a second sidewall of the second poly electrode that is opposite to the first sidewall; and a fourth capacitor dielectric layer disposed between the fourth poly electrode and the second poly electrode.

According to some embodiments, the first poly electrode, the third poly electrode, and the fourth poly electrode are electrically connected to an anode.

According to some embodiments, the second poly electrode is electrically connected to a cathode. The third poly electrode, the third capacitor dielectric layer, and the second poly electrode constitute a first capacitor. The first poly electrode, the second capacitor dielectric layer, and the second poly electrode constitute a second capacitor. The second poly electrode, the fourth capacitor dielectric layer, and the fourth poly electrode constitute a third capacitor.

According to some embodiments, an ion well is disposed within the capacitor forming region and is electrically connected to the cathode. The third poly electrode, the first capacitor dielectric layer and the ion well constitute a fourth capacitor, and the first poly electrode, the first capacitor dielectric layer and the ion well constitute a fifth capacitor.

According to some embodiments, a fifth capacitor dielectric layer is disposed between the fourth poly electrode and the semiconductor substrate. The fifth capacitor dielectric layer is thicker than the first capacitor dielectric layer. The fourth poly electrode, the fifth capacitor dielectric layer, and the ion well constitute a sixth capacitor.

According to some embodiments, a width of the first poly electrode is greater than a width of the second poly electrode.

According to some embodiments, the second capacitor dielectric layer, the third capacitor dielectric layer, and the fourth capacitor dielectric layer comprise an oxide-nitride-oxide (ONO) dielectric layer.

According to some embodiments, the PIP capacitor further comprises a hard mask layer capping the second poly electrode. A top surface of the hard mask layer is flush with a top surface of the fourth poly electrode.

According to some embodiments, the third capacitor dielectric layer and the fourth capacitor dielectric layer are in direct contact with a top surface of the first poly electrode.

According to some embodiments, the capacitor forming region is a trench isolation region.

According to another aspect of the invention, a method for forming a poly-insulator-poly (PIP) capacitor is disclosed. A semiconductor substrate comprising a capacitor forming region is provided. A first capacitor dielectric layer is formed on the capacitor forming region. A first poly electrode is formed on the first capacitor dielectric layer. A second capacitor dielectric layer is formed on the first poly electrode. A second poly electrode is formed on the second capacitor dielectric layer. A third poly electrode is formed adjacent to a first sidewall of the second poly electrode. A third capacitor dielectric layer is formed between the third poly electrode and the second poly electrode. A fourth poly electrode is formed adjacent to a second sidewall of the second poly electrode that is opposite to the first sidewall. A fourth capacitor dielectric layer is formed between the fourth poly electrode and the second poly electrode.

According to some embodiments, the first poly electrode, the third poly electrode, and the fourth poly electrode are electrically connected to an anode.

According to some embodiments, the second poly electrode is electrically connected to a cathode, and wherein the third poly electrode, the third capacitor dielectric layer, and the second poly electrode constitute a first capacitor, the first poly electrode, the second capacitor dielectric layer, and the second poly electrode constitute a second capacitor, and the second poly electrode, the fourth capacitor dielectric layer, and the fourth poly electrode constitute a third capacitor.

According to some embodiments, an ion well is formed within the capacitor forming region. The ion well is electrically connected to the cathode. The third poly electrode, the first capacitor dielectric layer and the ion well constitute a fourth capacitor. The first poly electrode, the first capacitor dielectric layer and the ion well constitute a fifth capacitor.

According to some embodiments, a fifth capacitor dielectric layer is formed between the fourth poly electrode and the semiconductor substrate. The fifth capacitor dielectric layer is thicker than the first capacitor dielectric layer. The fourth poly electrode, the fifth capacitor dielectric layer, and the ion well constitute a sixth capacitor.

According to some embodiments, a width of the first poly electrode is greater than a width of the second poly electrode.

According to some embodiments, the second capacitor dielectric layer, the third capacitor dielectric layer, and the fourth capacitor dielectric layer comprise an oxide-nitride-oxide (ONO) dielectric layer.

According to some embodiments, a hard mask layer caps the second poly electrode. A top surface of the hard mask layer is flush with a top surface of the fourth poly electrode.

According to some embodiments, the third capacitor dielectric layer and the fourth capacitor dielectric layer are in direct contact with a top surface of the first poly electrode.

According to some embodiments, the capacitor forming region is a trench isolation region.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
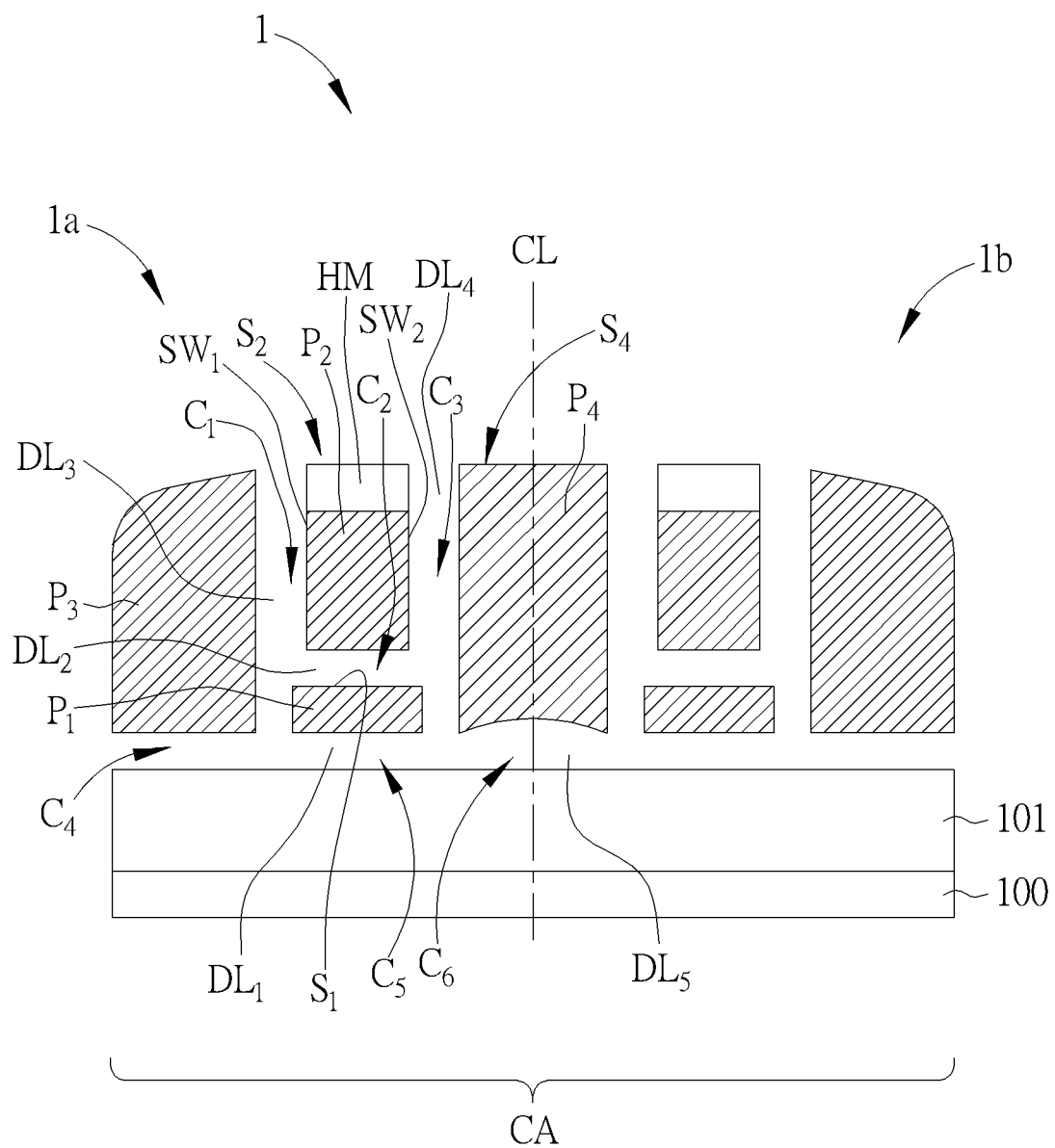
FIG. 1 is a schematic cross-sectional diagram of a PIP capacitor according to an embodiment of the present invention.
Figure 2:
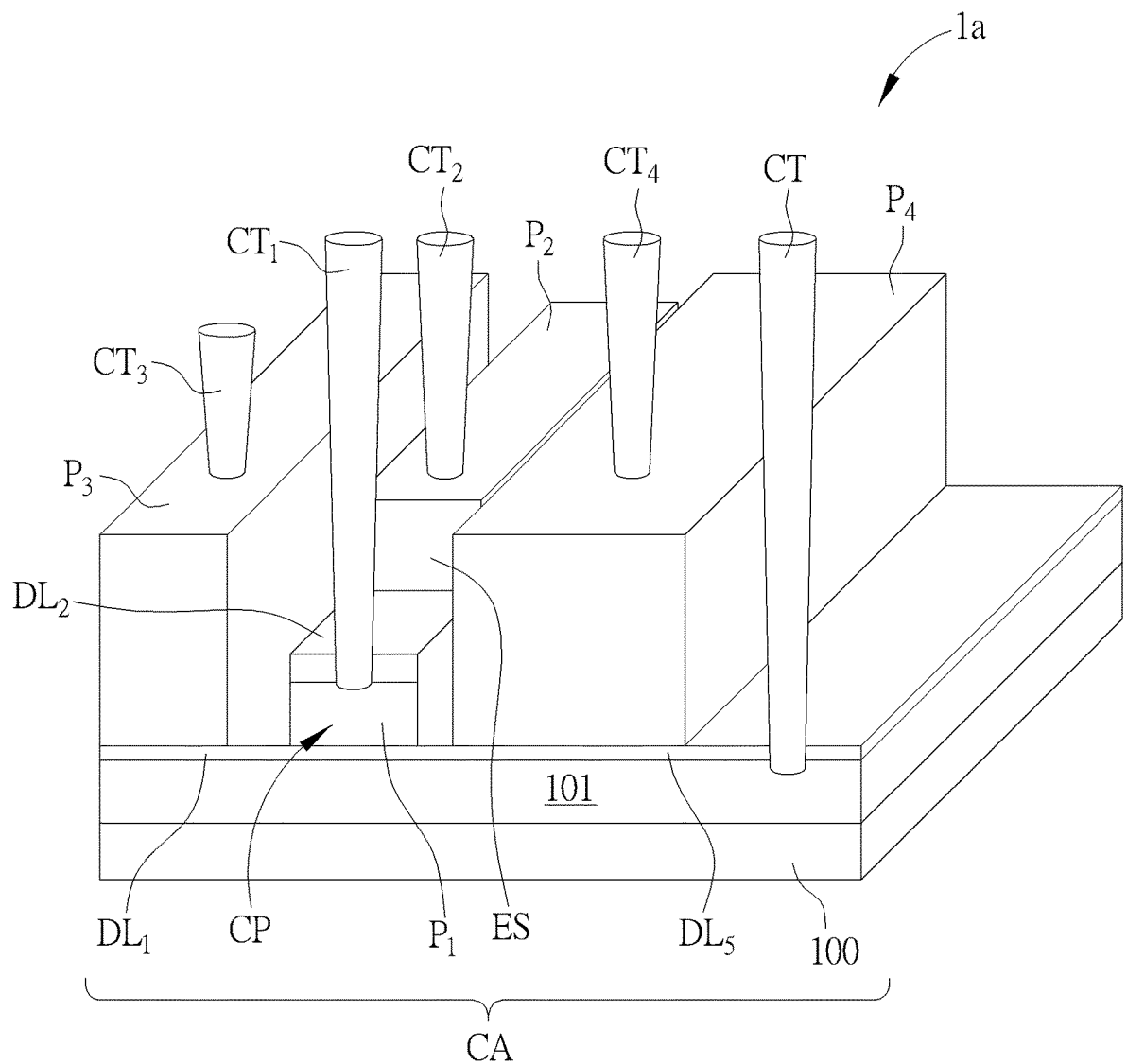
FIG. 2 is a side perspective view of the PIP capacitor in FIG. 1.
Figure 3:
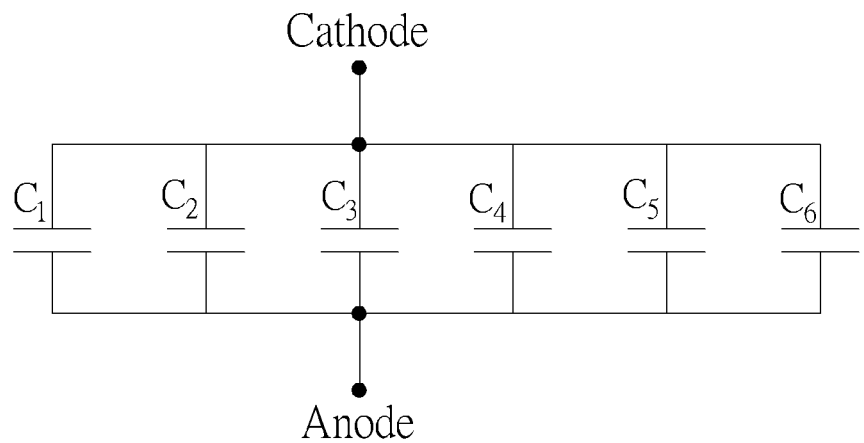
FIG. 3 is an equivalent circuit diagram of the PIP capacitor in FIG. 1.

Please refer to FIG. 1 to FIG. 3. FIG. 1 is a schematic cross-sectional diagram of a PIP capacitor according to an embodiment of the present invention. FIG. 2 is a side perspective view of the PIP capacitor in FIG. 1. FIG. 3 is an equivalent circuit diagram of the PIP capacitor in FIG. 1. As shown in FIG. 1, the integrated capacitor 1 of the present invention includes two PIP capacitors 1a and 1b that are mirror-symmetrical with respect to the central line CL, which are formed in the capacitance forming region CA of the semiconductor substrate 100. According to an embodiment of the present invention, the capacitor forming region CA may include an ion well 101, such as an N-type well (or N well). In some embodiments, the capacitor forming region CA may include a trench isolation area, for example, shallow trench insulation (STI) structure. In the following, the PIP capacitor 1a is taken as an example for description. In FIG. 2, only the PIP capacitor 1a is shown as an example.

As shown in FIG. 1 and FIG. 2, a first capacitor dielectric layer $DL_1$ is formed on the capacitor forming region CA. On the first capacitor dielectric layer $DL_1$, a first polysilicon electrode (or first poly electrode) $P_1$ is provided. On the first polysilicon electrode $P_1$, a second capacitor dielectric layer $DL_2$ is provided. On the second capacitor dielectric layer $DL_2$, a second polysilicon electrode (or second poly electrode) $P_2$ is provided. As shown in FIG. 2, the first polysilicon electrode $P_1$ includes a contact portion CP, and the contact portion CP protrudes beyond one end surface ES of the second polysilicon electrode $P_2$. On a first sidewall $SW_1$ adjacent to the second polysilicon electrode $P_2$, a third polysilicon electrode (or third poly electrode) $P_3$ is provided. Between the third polysilicon electrode $P_3$ and the second polysilicon electrode $P_2$, a third capacitor dielectric layer $DL_3$ is provided. A fourth polysilicon electrode (or fourth poly electrode) $P_4$ is provided on a second sidewall $SW_2$ adjacent to the second polysilicon electrode $P_2$. The second side wall $SW_2$ and the first side wall $SW_1$ are two opposite side walls. Between the fourth polysilicon electrode $P_4$ and the second polysilicon electrode $P_2$, a fourth capacitor dielectric layer $DL_4$ is provided.

According to an embodiment of the present invention, as shown in FIG. 2, the first polysilicon electrode $P_1$, the third polysilicon electrode $P_3$, and the fourth polysilicon electrode $P_4$ are electrically connected to anode through contact plugs $CT_1$, $CT_3$, and $CT_4$, respectively. According to an embodiment of the present invention, as shown in FIG. 2, the second polysilicon electrode $P_2$ is electrically connected to cathode through the contact plug $CT_2$. As shown in FIG. 1, the third polysilicon electrode $P_3$, the third capacitor dielectric layer $DL_3$ and the second polysilicon electrode $P_2$ constitute a first capacitor $C_1$. The first polysilicon electrode $P_1$, the second capacitor dielectric layer $DL_2$ and the second polysilicon electrode $P_2$ constitute a second capacitor $C_2$. The second polysilicon electrode $P_2$, the fourth capacitor dielectric layer $DL_4$ and the fourth polysilicon electrode $P_4$ constitute a third capacitor $C_3$. According to an embodiment of the present invention, the ion well 101 is electrically connected to the cathode through the contact plug CT. The third polysilicon electrode $P_3$, the first capacitor dielectric layer $DL_1$ and the ion well 101 constitute a fourth capacitor $C_4$. The first polysilicon electrode $P_1$, the first capacitor dielectric layer $DL_1$ and the ion well 101 constitute a fifth capacitor $C_5$.

According to an embodiment of the present invention, a fifth capacitor dielectric layer $DL_5$ is disposed between the fourth polysilicon electrode $P_4$ and the ion well 101 of the semiconductor substrate 100. The fifth capacitor dielectric layer $DL_5$ is thicker than the first capacitor dielectric layer $DL_1$. The fourth polysilicon electrode $P_4$, the fifth capacitor dielectric layer $DL_5$ and the ion well 101 constitute a sixth capacitor $C_6$. As shown in FIG. 3, the above-mentioned first capacitor $C_1$ to sixth capacitor $C_6$ form a parallel capacitor configuration.

According to an embodiment of the present invention, as shown in FIG. 1, a width of the first polysilicon electrode $P_1$ is slightly larger than a width of the second polysilicon electrode $P_2$. According to an embodiment of the present invention, the second capacitor dielectric layer $DL_2$, the third capacitor dielectric layer $DL_3$, and the fourth capacitor dielectric layer $DL_4$ may comprise an oxide-nitride-oxide (ONO) dielectric layer. According to an embodiment of the present invention, the PIP capacitor $1a$ further includes a hard mask layer HM capping the second polysilicon electrode $P_2$. A top surface $S_2$ of the hard mask layer HM is flush with a top surface $S_4$ of the fourth polysilicon electrode $P_4$. According to an embodiment of the present invention, the third capacitor dielectric layer $DL_3$ and the fourth capacitor dielectric layer $DL_4$ are in direct contact a top surface $S_1$ of the first polysilicon electrode $P_1$.

Figure 4:
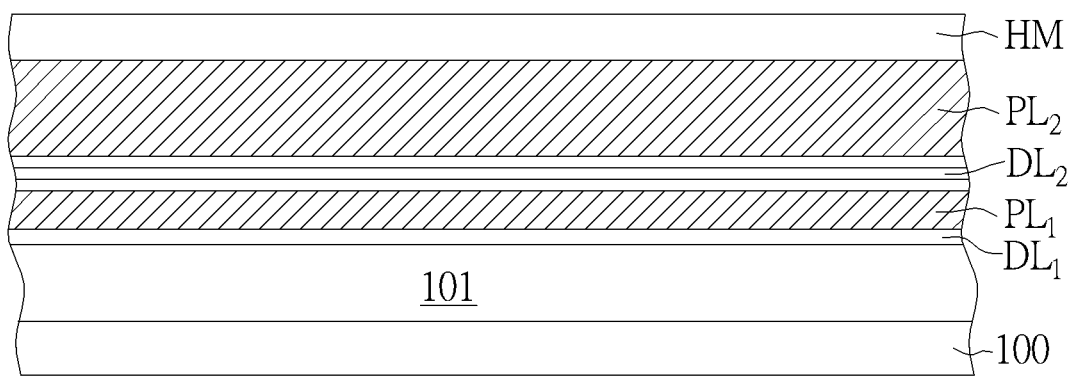
FIG. 4 to FIG. 8 are schematic cross-sectional diagrams showing a method of forming a PIP capacitor according to an embodiment of the present invention.

FIG. 4 to FIG. 8 are schematic cross-sectional diagrams showing a method for forming a PIP capacitor according to an embodiment of the present invention, wherein like regions, layers, and elements are designated by like reference numerals or labels. As shown in FIG. 4, first, a semiconductor substrate 100 is provided, which includes a capacitor forming region CA. An ion well 101, such as an N well, may be included in the capacitor forming region CA of the semiconductor substrate 100. In some embodiments, the capacitor forming region CA may include a trench isolation area, for example, STI structure. A first capacitor dielectric layer $DL_1$, a first polysilicon layer $PL_1$, a second capacitor dielectric layer $DL_2$, a second polysilicon layer $PL_2$, and a hard mask layer HM are sequentially formed on the capacitor forming region CA. According to an embodiment of the present invention, for example, the first capacitor dielectric layer $DL_1$ may be a silicon oxide layer, the second capacitor dielectric layer $DL_2$ may be an ONO dielectric layer, and the hard mask layer HM may be a silicon nitride layer, but not limited thereto. According to an embodiment of the present invention, for example, the thickness of the second polysilicon layer $PL_2$ may be greater than that of the first polysilicon layer $PL_1$, but is not limited thereto.

Figure 5:
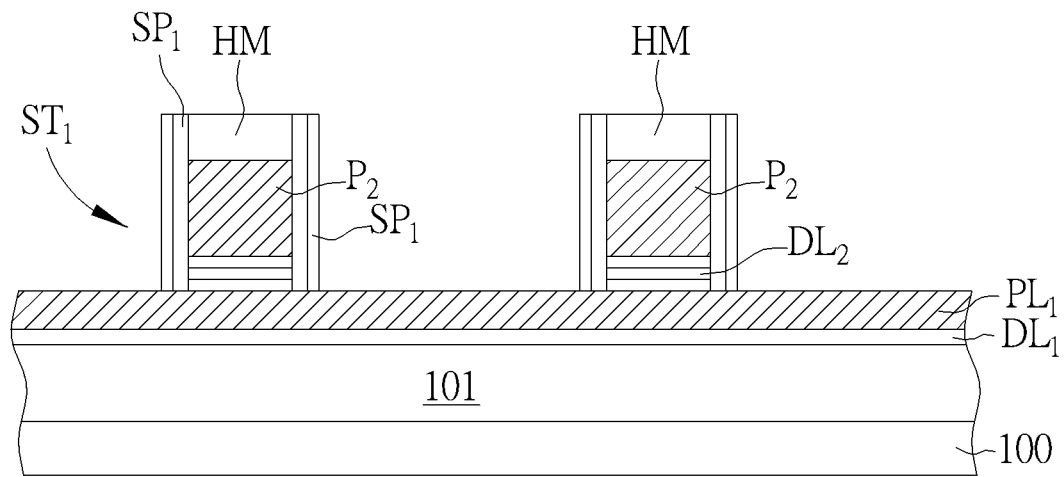

As shown in FIG. 5, lithography and etching processes are then performed to pattern the hard mask layer HM, the second polysilicon layer $PL_2$ and the second capacitor dielectric layer $DL_2$, and define a first stack structure $ST_1$ on the first polysilicon layer $PL_1$. The first stack structure $ST_1$ includes the second capacitor dielectric layer $DL_2$, the second polysilicon electrode $P_2$ and the hard mask layer HM. Then, first spacers $SP_1$, for example, oxide-nitride (ON) spacers, are formed on two opposite sidewalls of the first stack structure $ST_1$.

Figure 6:
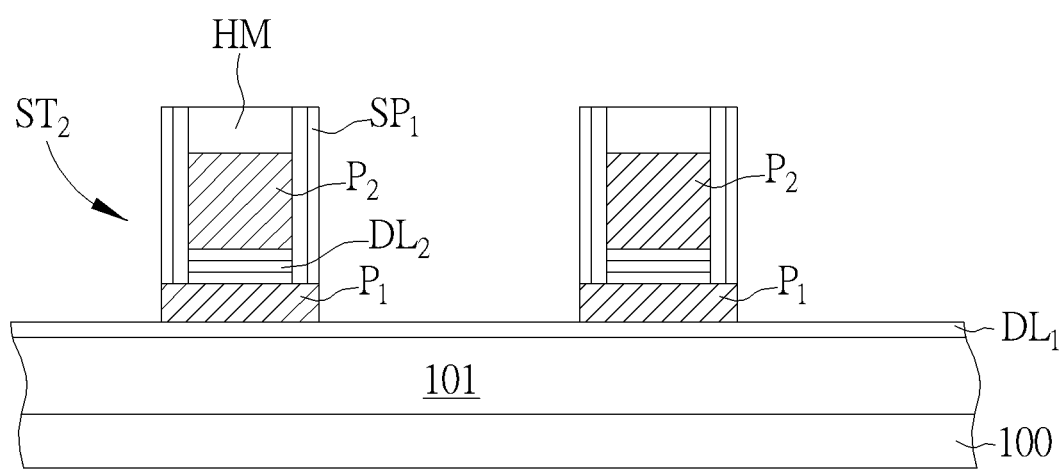

As shown in FIG. 6, the lithography and etching processes are performed to pattern the first polysilicon layer $PL_1$, and define a second stacked structure $ST_2$ on the first capacitor dielectric layer $DL_1$, including the first polysilicon electrode $P_1$, the second capacitor dielectric layer $DL_2$, the second polysilicon electrode $P_2$, the hard mask layer HM and the first spacers $SP_1$. According to an embodiment of the present invention, the sidewalls of the first polysilicon electrode $P_1$ may be approximately flush with the outer surface of the first spacers $SP_1$. According to an embodiment of the present invention, the width of the first polysilicon electrode $P_1$ is greater than the width of the second polysilicon electrode $P_2$. According to an embodiment of the present invention, as shown in FIG. 2, the first polysilicon electrode $P_1$ includes a contact portion CP, and the contact portion CP protrudes beyond one end surface ES of the second polysilicon electrode $P_2$.

Figure 7:
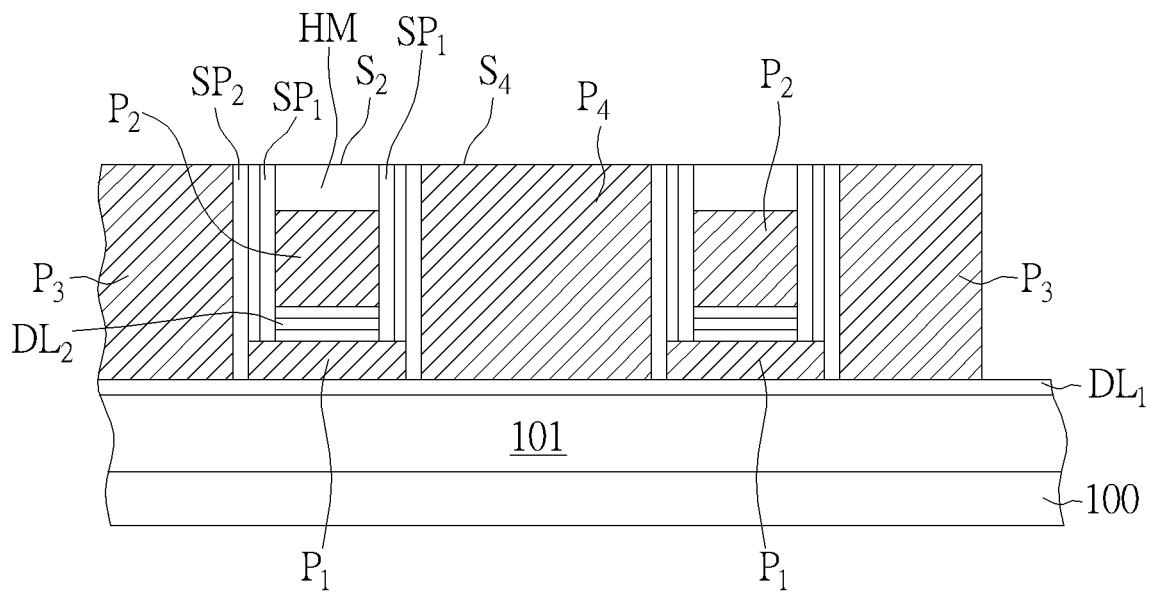

As shown in FIG. 7, second spacers $SP_2$, for example, silicon oxide spacers, are then formed on two sidewalls of the second stack structure $ST_2$. Then, a third polysilicon electrode $P_3$ and a fourth polysilicon electrode $P_4$ are formed on opposite sides of the second stack structure $ST_2$, respectively. To form the third polysilicon electrode $P_3$ and the fourth polysilicon electrode $P_4$, for example, a polysilicon layer is deposited in a blanket manner, and then a chemical mechanical polishing (CMP) process may be performed to planarize the polysilicon layer until the hard mask layer HM is exposed. According to an embodiment of the present invention, a top surface $S_2$ of the hard mask layer HM may be flush with a top surface $S_4$ of the fourth polysilicon electrode $P_4$.

Figure 8:
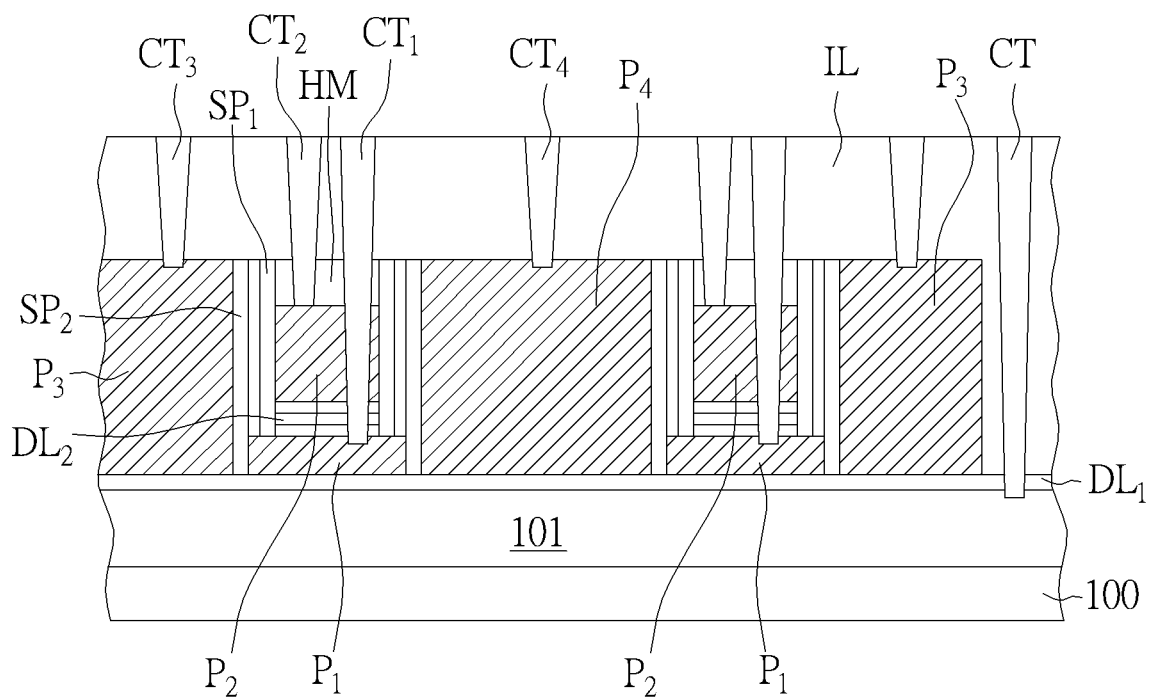

As shown in FIG. 8, a deposition process, for example, a chemical vapor deposition (CVD) process is performed to deposit an inter-layer dielectric layer IL on the semiconductor substrate 100. Then, lithography and etching processes may be performed to form contact plugs CT, $CT_1$ to $CT_4$ in the inter-layer dielectric layer IL, such that the first polysilicon electrode $P_1$, the third polysilicon electrode $P_3$, and the fourth polysilicon electrode $P_4$ are electrically connected to the anode through the contact plugs $CT_1$, $CT_3$ and $CT_4$ respectively, and that the ion well 101 and the second polysilicon electrode $P_2$ are electrically connected to the cathode through the contact plugs CT and $CT_2$, respectively.

It is advantageous to use the present invention because high-density PIP capacitors can be formed in the early stage of the semiconductor manufacturing process, which have high capacitance values and can withstand high voltages (for example, >10V). In addition, the manufacturing method of the PIP capacitor of the present invention is compatible with embedded flash memory process, for example, ESF3 (third-generation embedded SuperFlash or ESF3) platform.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a poly-insulator-poly (PIP) capacitor, comprising:
   providing a semiconductor substrate comprising a capacitor forming region;
   forming a first capacitor dielectric layer on the capacitor forming region;
   forming a first poly electrode on the first capacitor dielectric layer;
   forming a second capacitor dielectric layer on the first poly electrode;
   forming a second poly electrode on the second capacitor dielectric layer;
   forming a third poly electrode adjacent to a first sidewall of the second poly electrode;
   forming a third capacitor dielectric layer between the third poly electrode and the second poly electrode;
   forming a fourth poly electrode adjacent to a second sidewall of the second poly electrode that is opposite to the first sidewall;
   forming a hard mask layer capping the second poly electrode, and wherein a top surface of the hard mask layer is flush with a top surface of the fourth poly electrode; and
   forming a fourth capacitor dielectric layer between the fourth poly electrode and the second poly electrode, wherein the first poly electrode, the third poly electrode, and the fourth poly electrode are electrically connected to an anode.

2. The method according to claim 1, wherein the second poly electrode is electrically connected to a cathode, and wherein the third poly electrode, the third capacitor dielectric layer, and the second poly electrode constitute a first capacitor, the first poly electrode, the second capacitor dielectric layer, and the second poly electrode constitute a second capacitor, and the second poly electrode, the fourth capacitor dielectric layer, and the fourth poly electrode constitute a third capacitor.

3. The method according to claim 2, further comprising:
forming an ion well within the capacitor forming region, wherein the ion well is electrically connected to the cathode, and wherein the third poly electrode, the first capacitor dielectric layer and the ion well constitute a fourth capacitor, and the first poly electrode, the first capacitor dielectric layer and the ion well constitute a fifth capacitor.

4. The method according to claim 3, further comprising:
forming a fifth capacitor dielectric layer between the fourth poly electrode and the semiconductor substrate, wherein the fifth capacitor dielectric layer is thicker than the first capacitor dielectric layer, and wherein the fourth poly electrode, the fifth capacitor dielectric layer, and the ion well constitute a sixth capacitor.

5. The method according to claim 1, wherein a width of the first poly electrode is greater than a width of the second poly electrode.

6. The method according to claim 1, wherein the second capacitor dielectric layer, the third capacitor dielectric layer, and the fourth capacitor dielectric layer comprise an oxide-nitride-oxide (ONO) dielectric layer.

7. The method according to claim 1, wherein the third capacitor dielectric layer and the fourth capacitor dielectric layer are in direct contact with a top surface of the first poly electrode.

8. The method according to claim 1, wherein the capacitor forming region is a trench isolation region.

* * * * *